(12) United States Patent
Reboh et al.

(10) Patent No.: US 10,431,683 B2
(45) Date of Patent: Oct. 1, 2019

(54) METHOD FOR MAKING A SEMICONDUCTOR DEVICE WITH A COMPRESSIVE STRESSED CHANNEL

(71) Applicants: COMMISSARIAT A L'ENERGIE ATOMIQUE ET AUX ENERGIES ALTERNATIVES, Paris (FR); INTERNATIONAL BUSINESS MACHINES CORPORATION, Yorktown Heights, NY (US)

(72) Inventors: Shay Reboh, Grenoble (FR); Emmanuel Augendre, Montbonnot (FR); Remi Coquand, Les Marches (FR); Nicolas Loubet, Guilderland, NY (US)

(73) Assignees: COMMISSARIAT A L'ENERGIE ATOMIQUE ET AUX ENERGIES ALTERNATIVES, Paris (FR); INTERNATIONAL BUSINESS MACHINES CORPORATION, Yorktown Heights, NY (US)

(*) Notice: Subject to any disclaimer, the term of this patent is extended or adjusted under 35 U.S.C. 154(b) by 0 days.

(21) Appl. No.: 15/837,281

(22) Filed: Dec. 11, 2017

(65) Prior Publication Data

US 2018/0175194 A1    Jun. 21, 2018

(30) Foreign Application Priority Data

Dec. 15, 2016  (FR) .................................... 16 62529

(51) Int. Cl.
*H01L 21/00* (2006.01)
*H01L 29/78* (2006.01)
(Continued)

(52) U.S. Cl.
CPC ...... *H01L 29/7842* (2013.01); *H01L 29/0673* (2013.01); *H01L 29/1033* (2013.01);
(Continued)

(58) Field of Classification Search
None
See application file for complete search history.

(56) References Cited

U.S. PATENT DOCUMENTS

| 9,425,318 B1 | 8/2016 | Hoentschel et al. |
| 2014/0091279 A1* | 4/2014 | Kachian ................ B82Y 10/00 257/27 |

(Continued)

OTHER PUBLICATIONS

French Preliminary Search Report dated Aug. 3, 2017 in French Application 16 62529 filed on Dec. 15, 2016 (with English Translation of Categories of Cited Documents).

(Continued)

*Primary Examiner* — Reema Patel
(74) *Attorney, Agent, or Firm* — Oblon, McClelland, Maier & Neustadt, L.L.P.

(57) ABSTRACT

A method for making a semiconductor device, including:
  a) etching a stack of a layer of a second semiconductor, which is crystalline, arranged between a substrate and a layer of a first semiconductor, which is crystalline, the second semiconductor being different from the first semiconductor and subjected to a compressive stress, forming a nanowire stack,
  b) making a dummy gate and outer spacers, covering a part of the nanowire stack which is formed by portions of the nanowires,
  c) etching the nanowire stack such that only said part of the stack is preserved,
  d) removing the portion of the second semiconductor nanowire, (Continued)

e) depositing, in a space formed by this removal, a sacrificial material portion,
f) making source and drain regions and inner spacers,
g) removing the dummy gate and the sacrificial material portion,
h) making a gate.

18 Claims, 7 Drawing Sheets

(51) Int. Cl.
    *H01L 29/06*     (2006.01)
    *H01L 29/66*     (2006.01)
    *H01L 29/10*     (2006.01)
    *H01L 29/423*     (2006.01)
    *H01L 29/786*     (2006.01)
    *H01L 29/161*     (2006.01)

(52) U.S. Cl.
    CPC .... *H01L 29/1054* (2013.01); *H01L 29/42392* (2013.01); *H01L 29/6656* (2013.01); *H01L 29/66545* (2013.01); *H01L 29/66553* (2013.01); *H01L 29/66795* (2013.01); *H01L 29/7847* (2013.01); *H01L 29/78696* (2013.01); *H01L 29/161* (2013.01)

(56) References Cited

U.S. PATENT DOCUMENTS

| | | | |
|---|---|---|---|
| 2015/0263088 A1 | 9/2015 | Cheng et al. | |
| 2015/0270340 A1 | 9/2015 | Frank et al. | |
| 2015/0372115 A1* | 12/2015 | Koh | H01L 29/6656 438/301 |
| 2016/0027929 A1* | 1/2016 | Cheng | H01L 29/78696 257/9 |
| 2017/0133375 A1* | 5/2017 | Fung | H01L 21/823807 |

OTHER PUBLICATIONS

J M.Hartmann, et al. "Critical thickness for plastic relaxation of SiGe on Si(001) revisited," Journal of Applied Physics 110, 2011, pp. 9.
U.S. Appl. No. 14/555,897, filed Nov. 28, 2014, 2015/0155170 A1, Shay Reboh et al.
U.S. Appl. No. 14/575,329, filed Dec. 18, 2014, 2015/0179474 A1, Sylvain Maitrejean et al.
U.S. Appl. No. 14/901,027, filed Dec. 28, 2015, 2016/0372362 A1, Thomas Signamarcheix et al.
U.S. Appl. No. 14/950,416, filed Nov. 24, 2015, 2016/0149039 A1, Shay Reboh et al.
U.S. Appl. No. 15/049,468, filed Feb. 22, 2016, 2016/0254362 A1, Sylvain Maitrejean et al.
U.S. Appl. No. 15/070,781, filed Mar. 15, 2016, 2016/0276494 A1, Sylvain Barraud et al.
U.S. Appl. No. 15/092,002, filed Apr. 6, 2016, 2016/0300927 A1, Shay Reboh et al.
U.S. Appl. No. 15/261,226, filed Sep. 9, 2016, 2017/0076997 A1, Shay Reboh et al.
U.S. Appl. No. 15/352,198, filed Nov. 15, 2016, 2017/0141212 A1, Sylvain Barraud et al.
U.S. Appl. No. 15/490,212, filed Apr. 18, 2017, 2017/0309483 A1, Shay Reboh et al.
U.S. Appl. No. 15/457,447, filed Mar. 13, 2017, 2017/0263495 A1, Emmanuel Augendre et al.
U.S. Appl. No. 15/452,049, filed Mar. 7, 2017, 2017/0263607 A1, Sylvain Maitrejean et al.
U.S. Appl. No. 15/523,742, filed May 2, 2017, Shay Reboh et al.
U.S. Appl. No. 15/602,829, filed May 23, 2017, 2017/0345931, Shay Reboh et al.
U.S. Appl. No. 15/603,738, filed May 24, 2017, 2017/0345915, Remi Coquand et al.
U.S. Appl. No. 15/711,549, filed Sep. 21, 2017, Shay Reboh et al.

* cited by examiner

METHOD FOR MAKING A SEMICONDUCTOR DEVICE WITH A COMPRESSIVE STRESSED CHANNEL

TECHNICAL FIELD AND PRIOR ART

An embodiment of the invention relates to a method for making a semiconductor device, such as a GAA-FET ("Gate-All-Around Field Effect Transistor") transistor, with a compressive stressed channel. Another embodiment of the invention relates to a method for making N- and P-type transistors co-integrated on a same substrate and including channels differently stressed from each other, that is tensile stressed for the N-type transistor and compressive stressed for the P-type transistor.

In a GAA-FET-type transistor, the gate of the transistor is made all around the channel such that the channel is surrounded or encapsulated by the gate. Such a transistor has the advantage, in comparison with a conventional MOSFET transistor, of improving the electrostatic control of the channel by the gate (which enables the leakage currents of the transistor to be reduced), in particular when the transistor is fully depleted (for example of the FD-SOI, or Fully-Depleted Silicon On Insulator, type).

It is known to make a GAA-FET-type transistor comprising a stack of several semiconductor nanowires forming the channel of the transistor together. This configuration makes it possible to achieve a good compromise between electrostatic control of the channel by the gate and control current necessary in the transistor.

Adding a stress in the transistor channel contributes to the improvement of the transistor performance. This stress is preferably uniaxial and parallel to the direction of movement of the carriers in the channel. A compressive stress to which the channel is subjected enables the carrier mobility to be improved in a P-type transistor, whereas a tensile stress has a beneficial effect in an N-type transistor.

It is for example known to make a GAA-FET transistor from an alternate stack of silicon and SiGe layers. The silicon layers are intended to form the nanowires corresponding to the transistor channel. The first layer of the stack includes SiGe and is arranged onto a silicon (bulk or SOI) substrate. This SiGe, made by epitaxial growth from silicon, is biaxially compressive stressed because of the lattice mismatch between these two materials. On the other hand, silicon is relaxed and is in a non-stressed state.

This stack is first etched to form nanowires, also called nanosheets, a part of which is intended to form the transistor channel. This etching causes an at least partial relaxation of the stress in the SiGe nanowires, at least in parallel to the width of these nanowires (wherein this relaxation can also be biaxial, that is parallel to the length and the width of the nanowires). This relaxation generates a tensile deformation, or stress, in the silicon layers, along the direction parallel to the width of the nanowires, creating a slight tensile stress along the carrier transport direction in the silicon nanowires.

After a sacrificial gate and outer spacers have been formed, the stack of silicon and SiGe nanowires is etched in order to preserve only portions of these nanowires which are covered with the sacrificial gate and the outer spacers. Ends of the SiGe portions which are covered with the outer spacers are etched and the cavities formed by this etching are filled with a dielectric material to form the inner spacers. At this stage in the method, the silicon channels are subjected to a high tensile stress, with increasing intensity from the ends of the channel to its centre, generated by etching the nanowires.

The source and drain regions are then formed by epitaxial growth, and then packaged.

The sacrificial gate is then removed and then the remaining SiGe portions arranged between the silicon portions are removed in order to release the silicon nanowire portions forming the transistor channel. The silicon portions partially relax but preserve a tensile stress, for example in the order of 0.3 GPa in the centre of the channel.

This tensile stress is beneficial to N-type transistors but is an issue for P-type transistors for which a compressive stress of the channel is attempted.

DISCLOSURE OF THE INVENTION

Thus there is a need to provide a method enabling a semiconductor device comprising a compressive stressed channel to be made, from a stack of an initial material which promotes to making transistors with tensile stressed channels as previously described.

For this, it is provided a method for making a semiconductor device, including at least the following steps:

a) etching a stack of layers arranged on a substrate and comprising at least one layer of a second semiconductor, which is crystalline, arranged between the substrate and at least one layer of a first semiconductor, which is crystalline, and such that the second semiconductor is different from the first semiconductor and subjected to a compressive stress, forming at least one nanowire stack comprising at least one second semiconductor nanowire arranged between the substrate and at least one first semiconductor nanowire, b) making at least one dummy gate and outer spacers between which the dummy gate is arranged, covering at least part of the nanowire stack formed by portions of the first and second semiconductor nanowires, c) etching the nanowire stack such that only said part of the nanowire stack is preserved, d) removing the portion of the second semiconductor nanowire, e) depositing, into at least one space formed by removing the portion of the second semiconductor nanowire, at least one sacrificial material portion, f) making source and drain regions and inner spacers around parts of the portion of the first semiconductor nanowire which are covered with the outer spacers, g) removing the dummy gate and the sacrificial material portion, h) making a gate between the outer spacers and around the portion of the first semiconductor nanowire forming a channel.

In this method, the etchings implemented in steps a) and c) create a significant uniaxial tensile stress in the portion of the first semiconductor nanowire obtained at the end of step c), because of the compressive stress in the layer of the second semiconductor of the initial stack. This is particularly well adapted to make tensile stressed channels. However, by virtue of the removal of the portion of the second semiconductor nanowire which is made thereafter, the portion of the first semiconductor nanowire is no longer subjected to this tensile stress generated by the remaining portion of the second nanowire and is relaxed to come back to a substantially non stressed state. After depositing the sacrificial material portion into the space formed by removing the portion of the second semiconductor nanowire, steps f) to h) complete making the semiconductor device without impacting the stress in the portion of the first semiconductor nanowire intended to form the channel of the semiconductor device.

The uniaxial tensile stress created in the portion of the first semiconductor nanowire is parallel to the length (greatest dimension) of the first semiconductor nanowire (and parallel to the carrier direction of movement in the channel intended to be formed by the portion of the first semiconductor nanowire).

In the initial stack of layers, the second semiconductor is subjected to a compressive stress in a plane parallel to the surface of the substrate on which the stack of layers is arranged.

When the substrate also includes a crystalline semiconductor, the compressive stress to which the second semiconductor in the stack of layers is subjected may be due to a higher lattice parameter of the second semiconductor in comparison with that of the semiconductor of the substrate.

The first semiconductor may be similar to that of the substrate. More generally, the lattice parameter of the first semiconductor may be similar to that of the crystalline semiconductor of the substrate.

Further, in the initial stack of layers, the second semiconductor may be subjected to a biaxial compressive stress, that is stressed by forces oriented along directions in the plane of the layer of the second semiconductor and perpendicular with respect to each other.

The term "nanowire" designates any material portion with nanoscale dimensions and of an elongate shape, regardless of the cross-section shape of this portion. Thus, this term designates both elongate material portions with a circular or substantially circular cross-section, and also nano-beams or nano-bars shaped material portions including for example a rectangular or substantially rectangular cross-section.

The inner and outer spacers correspond to the dielectric elements electrically insulating the gate relative to the source and drain regions of the semiconductor device. The inner spacers are arranged in zones adjacent to the junctions, at least under the portion of the first semiconductor nanowire. The outer spacers cover at least part of the source and drain extension regions.

Advantageously:
the first semiconductor may be crystalline silicon, and/or
the second semiconductor may be SiGe having a germanium proportion higher than about 50%, and/or
the sacrificial material portion may include at least one dielectric and/or an amorphous semiconductor (for example hydrogen rich).

For example, the sacrificial material portion may include $SiO_2$ and/or amorphous SiGe and/or amorphous germanium and/or amorphous silicon and/or SiN.

The sacrificial material portion may include a non-stressed material or a tensile stressed material. A non-stressed material corresponds to a material which is not subjected to a compressive or tensile stress. A non-stressed sacrificial material or a tensile stressed sacrificial material is well adapted to obtain a zero or compressive stress in the channel of the device. A tensile stressed sacrificial material generates a compressive stress in the channel as soon as it is deposited when this stress is intrinsic to the material. If the tensile stress is generated in the sacrificial material after it is deposited, for example during a thermal annealing or a recrystallisation, the compressive stress is generated in the channel during this annealing or this recrystallisation.

The compressive stress in the channel may be generated by depositing hydrogen rich amorphous silicon or SiGe, and then by recrystallising it. This stress is in this case generated by the contraction, or volume reduction in the sacrificial material, upon switching from the amorphous state to the crystalline state. Before the amorphous silicon or amorphous SiGe is deposited, an oxide layer may be formed at least around the channels to subsequently enable the sacrificial material to be selectively removed.

When the sacrificial material generates a compressive stress in the channel, this stress is transferred to the source and drain regions which are made by epitaxial growth from the semiconductor of the channel. Thus, this compressive stress remains in the source and drain regions even after the subsequent removal of the sacrificial material.

The layer of the second semiconductor may preferably have a thickness lower than its plastic relaxation critical thickness. Thus, the apparition of defects in the channel which would be generated by the plastic relaxation of the material of the layer of the second semiconductor during this method is avoided. When the second semiconductor is SiGe, the value of this plastic relaxation critical thickness depends in particular on the germanium concentration in SiGe.

Step f) may include implementing:
etching of parts of the sacrificial material portion covered with the outer spacers, and then
making of the inner spacers in cavities formed by removing said parts of the sacrificial material portion, and then
making of the source and drain regions.

According to one particular embodiment, the method may further include, between steps g) and h), implementing the following steps:
thinning the portion of the first semiconductor nanowire,
epitaxially growing a layer of a compressive stressed third semiconductor around the portion of the first semiconductor nanowire, preferably conformally.

By making such an epitaxial growth, the compressive stress in the third epitaxially grown semiconductor, due for example to the lattice mismatch between the first semiconductor and the third semiconductor, is thereby found in the portion of the first semiconductor nanowire which is intended to form the channel of the semiconductor device, which enables the performance of the semiconductor device to be improved.

In this case, the method may further include, after epitaxially growing the third semiconductor layer and before step h), implementing an annealing making a diffusion of atoms of the third semiconductor at least in the portion of the first semiconductor nanowire.

According to another particular embodiment, the method may further include, between steps g) and h), implementing the following steps:
epitaxially growing a layer of a compressive stressed third semiconductor around the portion of the first semiconductor nanowire,
annealing making a diffusion of atoms of the third semiconductor at least in the portion of the first semiconductor nanowire,
thinning the set of the third semiconductor layer and the portion of the first semiconductor nanowire.

The thinning and epitaxial growth steps may be implemented such that at the end of these steps, the thickness of the set comprising the third semiconductor layer and the portion of the first semiconductor nanowire is substantially equal to the thickness of the portion of the first semiconductor nanowire before implementing these steps. This characteristic is advantageously achieved when thinning is made before epitaxial growth because the thickness of the epitaxially grown semiconductor is more readily controllable than the thickness of the semiconductor removed upon thinning.

Making the source and drain regions may include implementing at least one SiGe epitaxial growth having a germanium proportion between about 20% and 80%, forming the source and drain regions.

Advantageously, making the source and drain regions may include at least implementing a first epitaxial growth from at least the portion of the first semiconductor nanowire, forming a first part of the source and drain regions, and then a second epitaxial growth from the first part of the source and drain regions, forming a second part of the source and drain regions.

In this case, the first epitaxial growth may be implemented such that the first part of the source and drain regions includes semiconductor including carbon atoms. Making the first part of the source and drain regions by including carbon atoms enables an uncontrolled diffusion of dopants present in the source and drain regions to be avoided or reduced from these regions up to the channel upon epitaxially growing the second part of the source and drain regions.

The stack of layers may include several layers of the first semiconductor and several layers of the second semiconductor which are alternately stacked over each other, the nanowire stack obtained at the end of step a) including several second semiconductor nanowires and several first semiconductor nanowires.

Advantageously, the semiconductor device may be a P-type GAA-FET transistor. Thus, this method enables a P-type transistor to be made from a stack of layers which is adapted to make an N-type transistor.

It is also provided a method for making N and P-type transistors co-integrated on a same substrate, including at least the following steps:
  implementing steps a) to c) of the method for making a semiconductor device, such that several remaining parts of the stack of layers each covered with a dummy gate and with outer spacers form first and second structures intended to form the N and P-type transistors respectively,
  forming at least one first packaging material on the first structures,
  implementing steps d) to h) of the method for making a semiconductor device from the second structures, forming the P-type transistors,
  removing the first packaging material and forming at least one second packaging material on the P-type transistors,
  making the N-type transistors from the first structures.

It is also provided a method for making N and P-type transistors co-integrated on a same substrate, including at least the following steps:
  implementing steps a) to c) of the method for making a semiconductor device, such that several remaining parts of the stack of layers each covered with a dummy gate and with outer spacers form first and second structures intended to form the N and P-type transistors respectively,
  forming at least one first packaging material on the second structures,
  making the N-type transistors from the first structures,
  removing the first packaging material and forming at least one second packaging material on the N-type transistors,
  implementing steps d) to h) of the method for making a semiconductor device from the second structures, forming the P-type transistors.

It is also provided a method for making N and P-type transistors enabling both a tensile stress in the channels of the N-type transistors (the etchings implemented in steps a) and c) create a significant uniaxial tensile stress in the portion of the first semiconductor nanowire obtained at the end of step c), because of the compressive stress in the layer of the second semiconductor of the initial stack) and a compressive stress in the channels of the P-type transistors to be obtained, thus providing a good performance to all the transistors being made.

Making the N-type transistors may include the following steps:
  making source and drain regions and inner spacers around parts of the portion of the first semiconductor nanowire which are covered with the outer spacers,
  removing the dummy gate and the portion of the second semiconductor nanowire,
  making a gate between the outer spacers and around the portion of the first semiconductor nanowire forming a channel.

BRIEF DESCRIPTION OF THE DRAWINGS

The present invention will be better understood upon reading the description of exemplary embodiments given by way of indicating and in no way limiting purposes making reference to the appended drawings in which.

Identical, similar or equivalent parts in the different figures described hereinafter bear the same reference numerals so as to facilitate switching from one Fig. to the other.

Figure 1A:
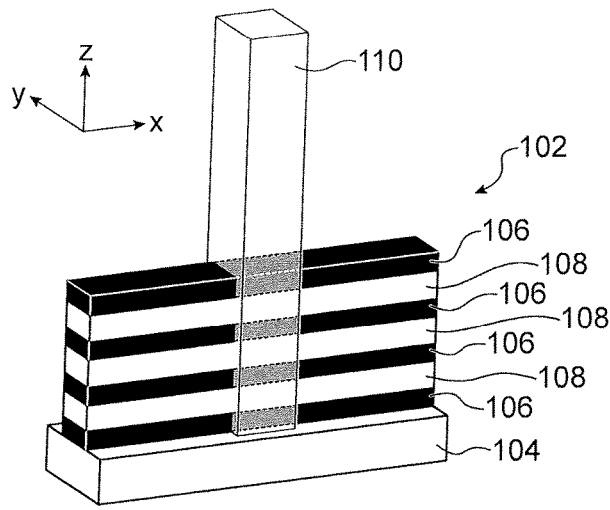
FIGS. 1A to 1L show the steps of a method for making a semiconductor device according to a first embodiment.

The different parts shown in the figures are not necessarily drawn to a uniform scale, to make the figures more readable.

The different possibilities (alternatives and embodiments) should be understood as being not exclusive to each other and can be combined to each other.

DETAILED DISCLOSURE OF PARTICULAR EMBODIMENTS

FIGS. 1A to 1L are referred to, which show the steps implemented for making a semiconductor device 100, here corresponding to a P-type GAA-FET transistor, according to a first embodiment.

The device 100 is made from a stack of layers of two different crystalline semiconductors which is arranged on a substrate 104. In the first embodiment described herein, the substrate 104 corresponds to a "bulk" semiconductor substrate, for example comprising silicon, on which the stack comprising first and second layers of two different semiconductors alternately arranged above each other is arranged. Each of the first layers is intended to form a semiconductor nanowire of the channel of the device 100 and is arranged between two second layers including a material able to be selectively etched relative to that of the first layers as well as relative to materials intended to be used thereafter to form a dummy gate and outer and inner spacers. In the first embodiment described herein, this stack includes three first layers as well as four second layers alternately arranged such that each of the first layers is arranged between two second layers.

The materials of the first and second layers correspond to first and second crystalline semiconductors that can be formed by epitaxial growth on the substrate 104.

In the example described herein, the substrate 104 and the first layers include silicon and the second layers include SiGe with a germanium proportion for example between about 30% ($Si_{0.7}Ge_{0.3}$) and 60% ($Si_{0.4}Ge_{0.6}$).

Alternatively, the substrate being used can correspond to a SOI (Silicon On Insulator) substrate, with in this case the superficial layer, or thin layer, of the SOI substrate which can form one of the second layers of the stack (when the second layers include SiGe, a Ge enriching is made in the silicon of the superficial layer in order to transform this silicon into SiGe).

Advantageously, the substrate 104 and the first and second layers of the stack are adapted to make P-type transistors such as the device 100, but also N-type transistors. Thus, in order to provide a significant tensile stress in the channels of the N-type transistors, the germanium concentration in SiGe of the second layers is advantageously higher than or equal to about 50%, or even higher than or equal to about 60%. In other words, the material of the second layers is advantageously $Si_xGe_{1-x}$ with X≤0.5 or X≤0.4.

Each of the first and second layers has for example a thickness between about 5 nm and 9 nm. However, the thickness of each of the second layers is chosen such that it is lower than its plastic relaxation critical thickness, in order to avoid a stress loss and a creation of defects in the channels of the transistors. This plastic relaxation critical thickness corresponds to the material thickness beyond which the built-up elastic energy is sufficient for dislocations to be formed and depends in particular, in the case of a SiGe layer, on the germanium concentration of SiGe. Thus, for a $Si_{0.4}Ge_{0.6}$ layer formed on a silicon layer, the elastic relaxation critical thickness is equal to about 10 nm. Details about the determination of this plastic relaxation critical thickness are given for example in the document "Critical thickness for plastic relaxation of SiGe on Si(001) revisited" by J. M. Hartmann et al., J. Appl. Phys. 110, 083529, 2011.

The stack of layers comprising the first and second layers is etched as an elongate portion as shown in FIG. 1A, and forming a nanowire stack 102 arranged on the substrate 104. When several devices 100 are collectively made from the same stack of layers, several stacks 102 are made.

The portions from the first layers form first nanowires 108 of the first semiconductor and the portions from the second layers form second nanowires 106 of the second semiconductor. In the example of FIG. 1A, the stack 102 includes three first nanowires 108 each arranged between two second nanowires 106.

The width of the stack 102, which corresponds to the dimension along axis Y, is equal to the desired width of the first nanowires 108 intended to make the channel of the device 100.

A dummy gate 110 is then made, for example by lithography and etching, on the stack 102, in the location intended to the future gate of the device 100. The dummy gate 110 is formed on portions of the first nanowires 108 which are intended to form the channel of the device 100, and portions of the second nanowires 106 between which these portions of the first nanowires 108 are located, and also covers side flanks of the nanowires 106, 108 of the stack 102.

Outer spacers 112 are then made, for example by depositing and etching, on the stack 102, and against side flanks of the dummy gate 110. These outer spacers 112 cover parts of the second nanowires 108 intended to be located on either side of the junctions. The length, or depth, of these outer spacers 112 (dimension parallel to the axis X shown in FIG. 1A) is for example between about 3 and 8 nm. The outer spacers 112 are intended to insulate the gate relative to the source and drain.

The dummy gate 110 includes for example amorphous or polycrystalline silicon, and the outer spacers 112 include for example SiN and/or $Si_3N_4$ and/or SiBCN.

The parts of the stack 102 which are not covered with the dummy gate 110 and with the outer spacers 112 are also etched (FIG. 1B), for example upon etching the outer spacers 112. The remaining portions 114 of the first nanowires 108 are intended to form the channel of the device 100. Each of the portions 114 is interposed between two remaining portions 116 of the second nanowires 106. The remaining portions 114 and 116 correspond to nanowires (with a length lower than that of the initial nanowires 106, 108).

Figure 1B:
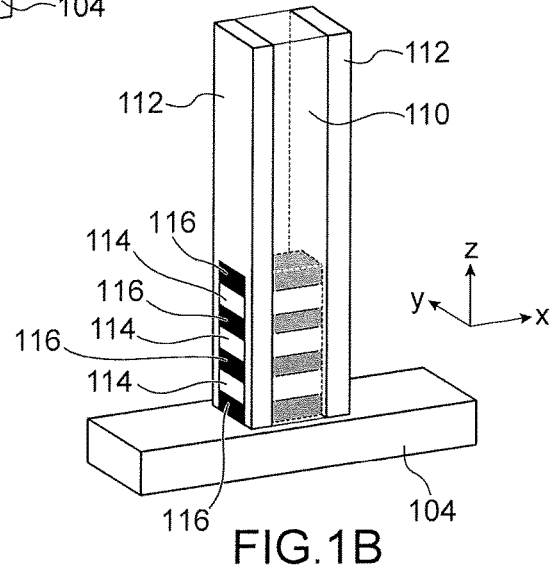
Figure 1C:
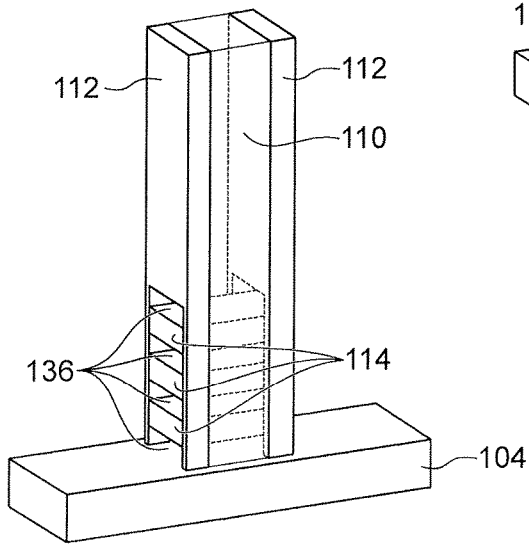

The portions 116 of the second semiconductor nanowires are then selectively etched relative to other materials in presence, that is relative to the first semiconductor of the portions 114 (by virtue of the fact that the germanium concentration in the second semiconductor is higher than that in the first semiconductor), to the material of the dummy gate 110 and to the material of the outer spacers 112, forming cavities 136 between which the portions 114 are located (FIG. 1C).

Figure 1D:
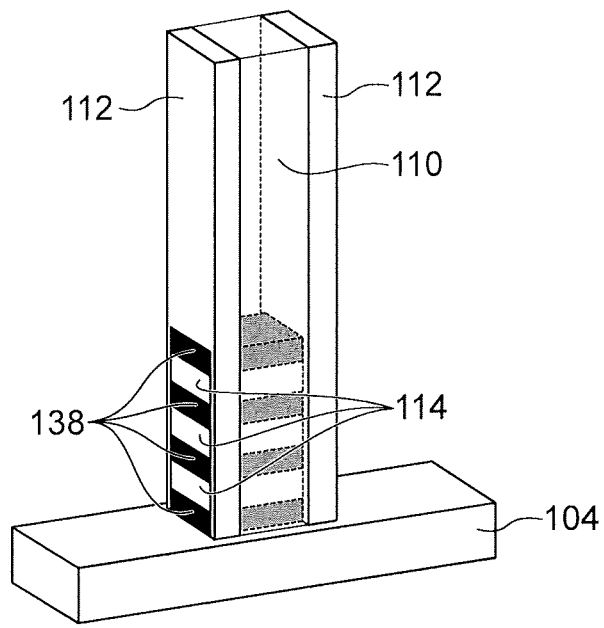

A sacrificial material able to be selectively etched relative to the portions 114, to the dummy gate 110, to the outer spacers 112, to the future source and drain regions of the device 100 and to the future inner spacers of the device 100, is then deposited into the cavities 136, forming portions 138 between which the portions 114 are arranged (FIG. 1D). The material of the portions 138 corresponds for example to an amorphous semiconductor such as SiGe with a high germanium concentration (for example higher than or equal to about 20%), or even germanium. For example, when the source and drain regions of the device 100 are intended to be subsequently made of SiGe, the germanium concentration in the SiGe of the portions 138 can be higher than about 20% with respect to that of SiGe of the source and drain regions. In this case, the portions 138 can be formed via a selective deposition method such that the material of the portions 138 is only deposited around the portions 114.

Alternatively, the material of the portions 138 can be a dielectric material such as SiN or SiBCN, and such a dielectric material cannot be initially located in a stack of epitaxially grown crystalline layers. In this case, the dielectric material deposited outside the cavities 136 (because of the non-selective deposition which is implemented to form such portions 138) is removed before continuing the method, for example via the directional implementation such as an RIE etching.

It is also possible to choose, for making the portions 138, a sacrificial material including inherently a tensile stress and which thereby generates, in the portions 114, a compressive stress. Such a material corresponds for example to a hydrogen rich amorphous silicon or hydrogen rich amorphous SiGe, or even SiN including a tensile stress. In the case of portions 138 made with silicon or SiGe, which is amorphous and hydrogen rich, a step of recrystallising these semiconductors is implemented after being deposited to generate a compressive stress in the channel. This stress is generated by the contraction, or volume reduction, during the amorphous—crystalline transformation. Before depositing Si or SiGe to form the portions 138, an oxide layer is advantageously deposited around the portions 114 to be able to make thereafter a selective removal of the portions 138.

The sacrificial material of the portions 138 is therefore chosen here such that it does not correspond to a compressive stressed material. Thus, the sacrificial material of the portions 138 corresponds either to a non stressed material, or to a tensile stressed material. Thus, having replaced the SiGe portions 116 with the portions 138 of non compressive stressed material, the silicon of the portions 114, which was highly tensile stressed because of the presence of the SiGe portions 116, is relaxed and the tensile stress in the silicon portions 114 becomes substantially zero (and optionally replaced with a compressive stress).

Figure 1E:
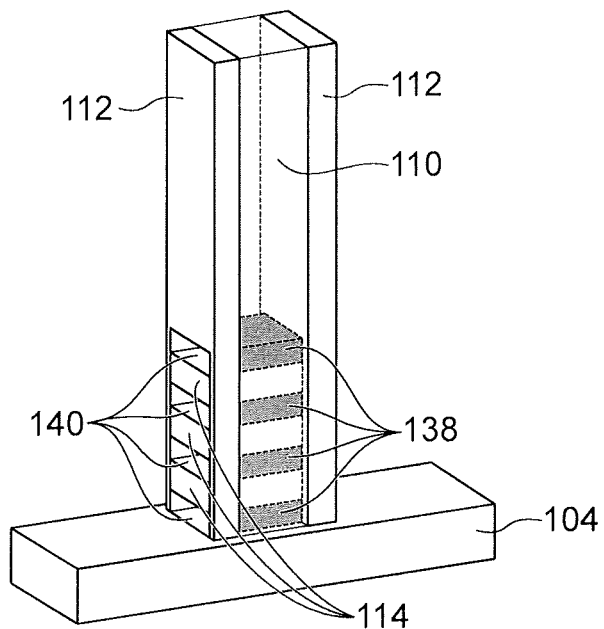

The parts, or ends, of the portions 138 which are covered with the outer spacers 112 are etched, forming cavities 140 between which the ends of the portions 114 are located (FIG. 1E).

Figure 1F:
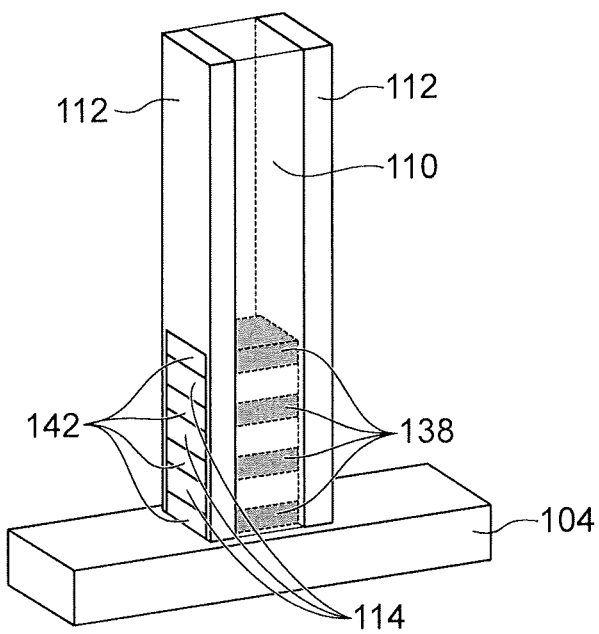

As shown in FIG. 1F, the cavities 140 are filled with a low permittivity (lower than about 3.9) dielectric material forming inner spacers 142.

At this stage in the method, unlike the method of prior art in which the semiconductor portions intended to form the channel are subjected to a high tensile stress, with an increasing intensity from the channel ends to its centre, the material (silicon) of the remaining portions 114 is not stressed or subjected to a tensile stress highly reduced by virtue of the removal of the SiGe portions 116, or even subjected to a compressive stress.

Figure 1G:
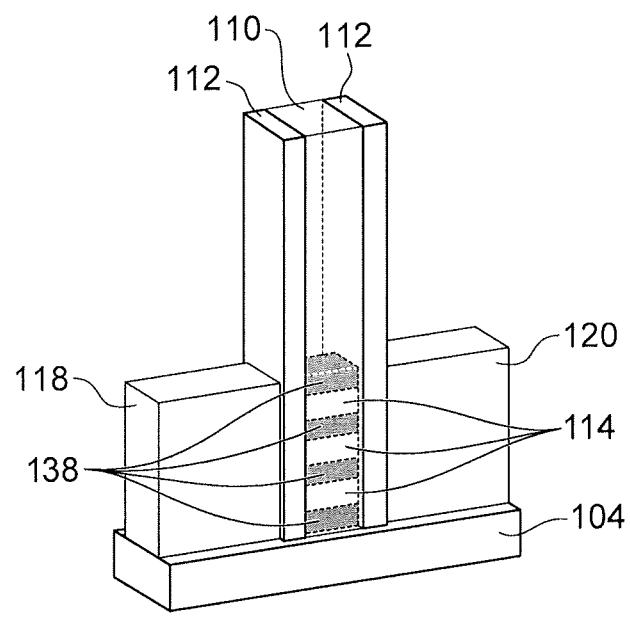
Figure 1H:
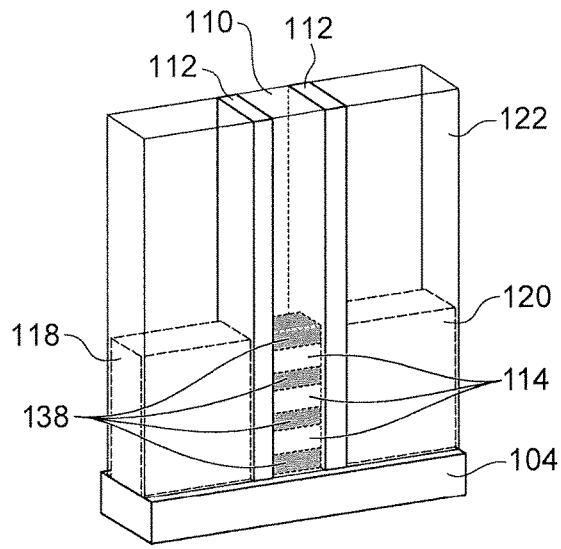

As shown in FIG. 1G, the source and drain regions 118, 120 are then made by epitaxial growth on the substrate 104, from the ends of the portions 114 (and of the substrate 104 when it includes a crystalline semiconductor from which an epitaxial growth can be made). These source and drain regions 118, 120 are made with one or several layers with an in situ doping so as to obtain a good junction quality. For example, the doping of the material of the source and drain regions 118, 120 can be made with boron doping atoms the concentration of which is for example between about $10^{18}$ and $10^{21}$ at/cm$^3$. The material of the source and drain regions 118, 120 is here SiGe:B.

In the first embodiment described here, the source and drain regions 118, 120 include SiGe. The germanium concentration of SiGe of the source and drain regions 118, 120 is for example between about 20% ($Si_{0.8}Ge_{0.2}$) and 80% ($Si_{0.2}Ge_{0.8}$).

According to one particular embodiment, it is possible that the source and drain regions 118, 120 are obtained by implementing several epitaxial growths, enabling materials of different compositions (for example by varying the germanium concentration between the epitaxial growths) and/or different concentrations to be grown. For example, making the source and drain regions 118, 120 can include implementing a first SiGe epitaxial growth including carbon atoms, and then a second SiGe epitaxial growth not including carbon atoms. Thus, because the epitaxial growth is implemented with an in situ doping of the source and drain regions 118, 120 being formed, the SiGe portion comprising carbon atoms which is initially formed enables the diffusion of dopants into the channel region of the device 100 to be reduced.

When the material of the substrate 104 on which the stack is arranged is also a crystalline material, the surface of this material is also used for the growth of the crystalline material of the source and drain regions 118, 120.

When the material of the portions 114 is subjected to a compressive stress brought by the sacrificial material portions 138, this compressive stress is also found in the source and drain regions 118, 120.

A packaging material 122 is then deposited onto the source and drain regions 118, 120 (FIG. 1H) in order not to alter these regions upon implementing subsequent steps.

Figure 1I:
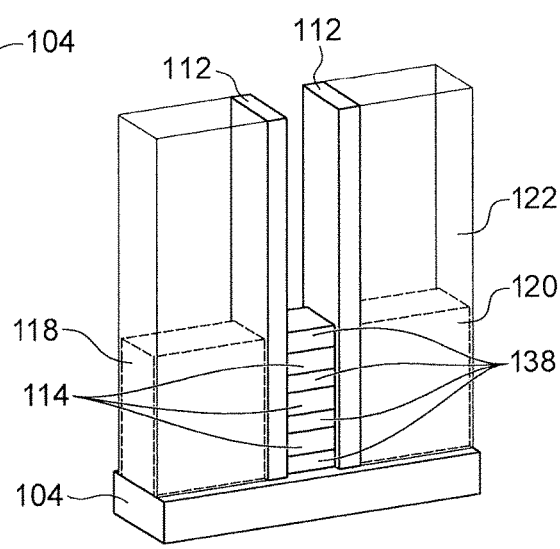
Figure 1J:
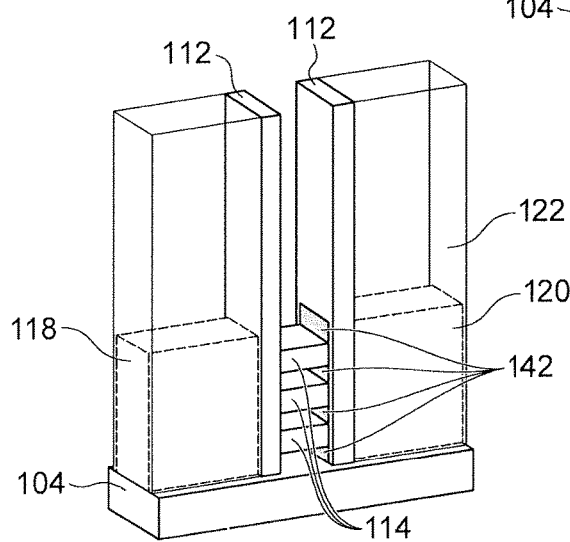

As shown in FIG. 1I, the dummy gate 110 is then removed, revealing the portions 114 and 138.

A selective etching of the sacrificial material portions 138 relative to the portions 114 of the first semiconductor nanowire, the source and drain regions 118, 120 and the outer spacers 112 is then implemented in order to release the portions 114 intended to form the channel of the device 100. This etching corresponds for example to a chemical etching HCl/H$_2$. This etching also reveals, in the space released between the outer spacers 112, the inner spacers 142.

Figure 1K:
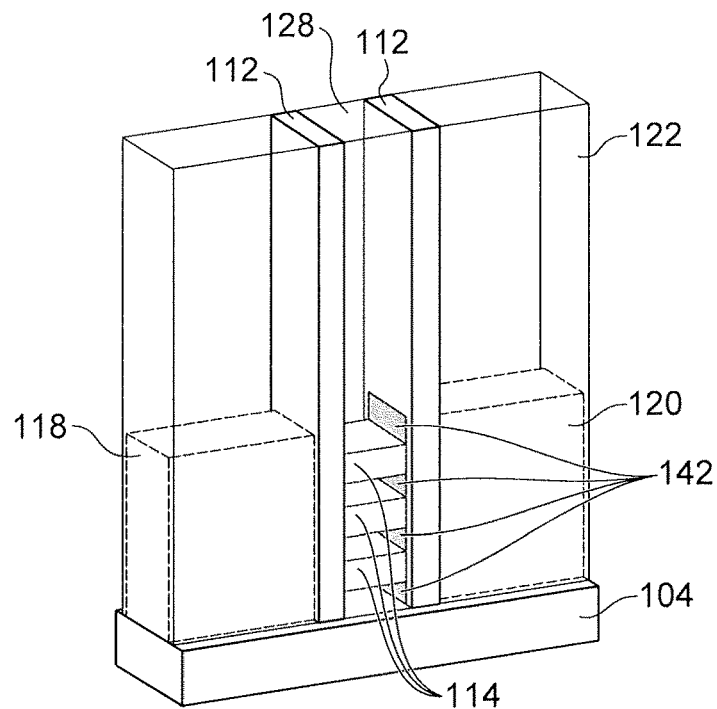

A gate 128, comprising at least one gate dielectric and one gate conductive material, is then made between the outer spacers 112, in the location previously occupied by the dummy gate 110 (FIG. 1K). The gate 128 thus made surrounds the portions 114 and is electrically insulated from the source and drain regions 118, 120 by the inner spacers 142 and the outer spacers 112.

Thus, the inner spacers 142 enable capacity effects to be reduced between the gate 128 and the source and drain regions 118, 120.

Figure 1L:
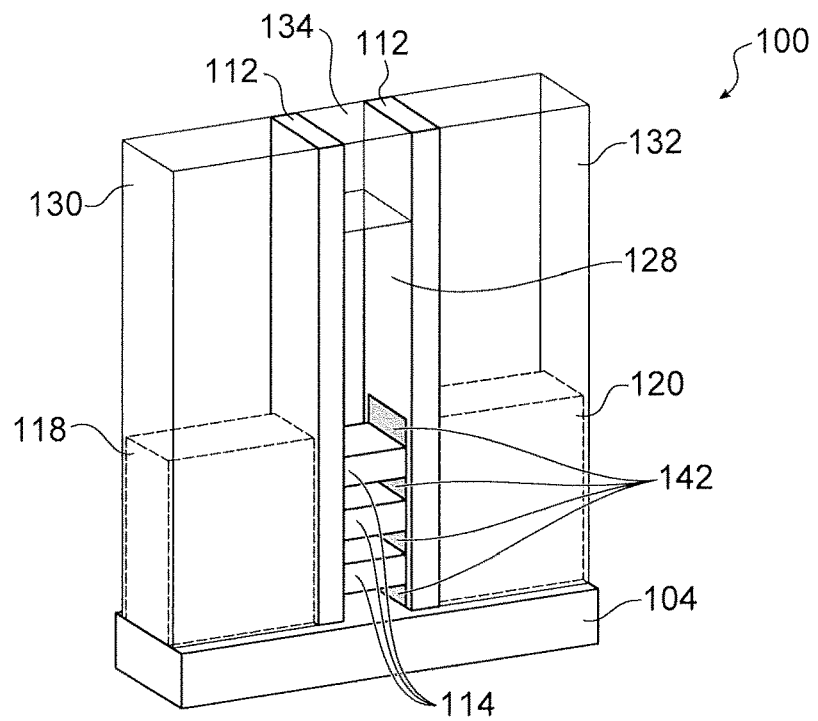

The device 100 is completed by partially removing the packaging material 122, forming accesses to reach the gate, the source and the drain, and forming electrical contacts 130, 132 and 134 on the source and drain regions 118, 120 and on the gate 128 (FIG. 1L).

The P-type GAA-FET transistor 100 which is obtained therefore includes a channel formed by the nanowires corresponding to the portions 114 which comprise non tensile stressed silicon or very lowly tensile stressed silicon, or even compressive stressed silicon, by virtue of the replacement of the initial compressive stressed SiGe with the sacrificial material of the portions 138 made during the method.

When the sacrificial material of the portions 138 is a semiconductor, a step of epitaxial growth from this semiconductor can be implemented before the epitaxial growth forming the source and drain regions 118, 120. In this case, the source and drain regions can include a semiconductor different from that previously epitaxially grown, for example SiGe if amorphous Si is previously used to form the portions 138, or Si or SiGe including less Ge than that of the portions 138 when the portions 138 include SiGe.

Making the P-type GAA-FET transistor 100 according to a second embodiment will now be described in connection with FIGS. 2A and 2B.

The steps previously described in connection with FIGS. 1A to 1J are first implemented. At the end of these steps, the silicon of the remaining portions 114 is relaxed and not stressed. The steps which are then implemented and described below in connection with FIGS. 2A and 2B enable a high compressive stress to be provided to the semiconductor of the channel of the transistor 100.

Figure 2A:
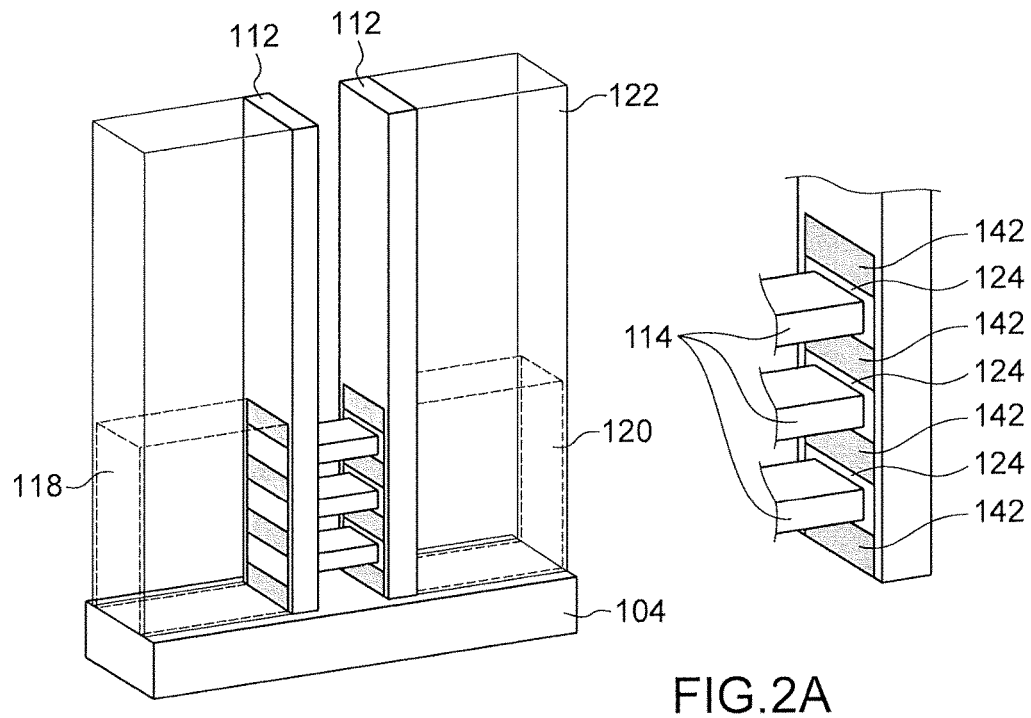
FIGS. 2A and 2B show a part of the steps of a method for making a semiconductor device according to a second embodiment.

For this, the portions 114 are thinned, for example by at least a thickness between about 1 nm and 3 nm by edge, in order to expose the parts 124 from the portions 114 and located in the source and drain extension regions (parts of the first semiconductor surrounded by the outer spacers 112) and which are arranged between the inner spacers 142 (FIG. 2A). This thinning can be achieved by implementing an oxidation of the first semiconductor of the portions 114 and then an etching of the oxidised semiconductor. These steps can be implemented at the same time, or during a same set of steps, as the oxidation and etching steps forming the inner spacers 142.

Figure 2B:
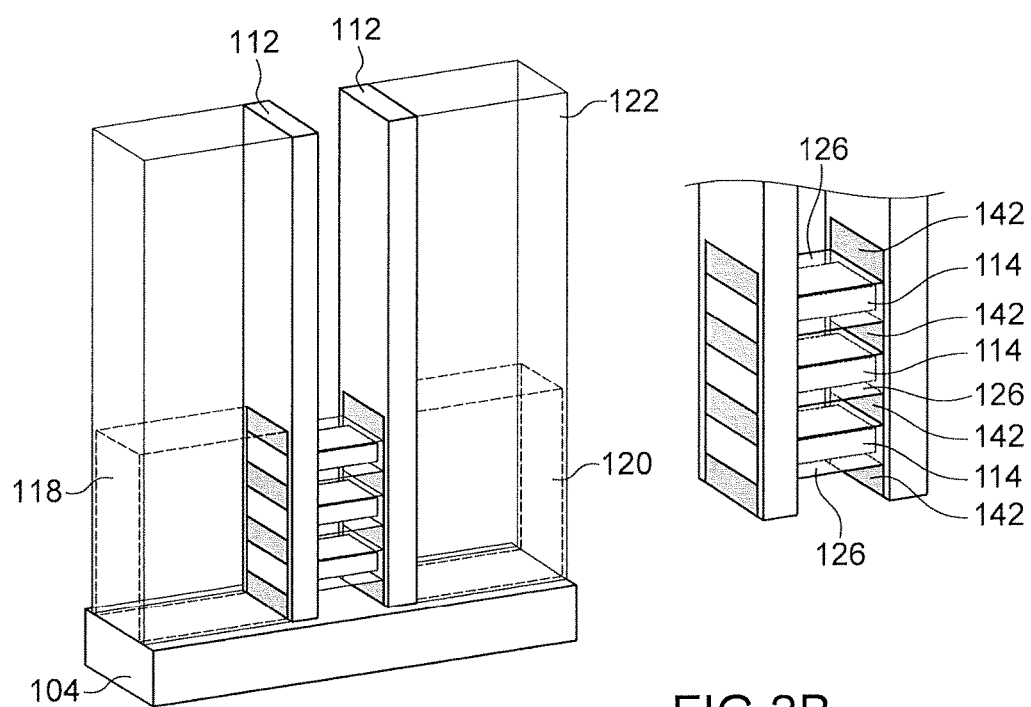

An epitaxial growth of a third semiconductor, for example a III-V semiconductor such as SiGe or germanium, is then implemented on the thinned portions 114 (FIG. 2B). The layers 126 formed by this conformal epitaxial growth (that is forming layers having equal thicknesses on all the sides of the portions 114) surround the parts of the portions 114 intended to form the channel. Advantageously, the thickness of the epitaxially grown layer 126 is substantially equal to the thickness of the semiconductor etched during the previous thinning. Thus, the external edges of the layer 126 are aligned with the initial interfaces (before thinning) between the inner spacers 142 and the portions 114. The SiGe of the epitaxially grown layers 126 on the portions 114 includes a germanium concentration between about 20% and 100%, and advantageously a germanium concentration between about 20% and 80% when this epitaxial growth is followed by the implementation of a thermal annealing, or about 30% and 40% in the absence of this thermal annealing.

Because the silicon of the portions 114 have been previously relaxed thanks to the replacement of the portions 116 with the sacrificial material portions 138, this SiGe epitaxial growth around the portions 114 generates a significant compressive stress of the silicon of the portions 114, which enables high performance P-type transistors to be made. At this stage in the method, the channel of the transistor 100 is thus formed by the silicon portions 114 and SiGe layers 126.

Optionally, a thermal annealing can then be implemented so as to diffuse the third semiconductor of the layers 126 in the silicon of the portions 114 in order to obtain a more homogenous material, corresponding to a highly compressive stressed SiGe and forming the channel of the device 100. This annealing can also modify the semiconductor located in the source and drain extension regions (semiconductor portions from the layers 108 and located between the inner spacers 142) because of the germanium migration that can come from the layers 126 or from the source and drain regions 118, 120, enabling a more homogenous material to be obtained also in the source and drain extension regions. The parameters for implementing the annealing are also chosen such that the dopant migration of the source and drain to the channel is as limited as possible.

The method is then completed as previously described for the first embodiment, that is implementing the steps previously described in connection with FIGS. 1K and 1L.

The use of a compressive stressed sacrificial material for making the portions 138 which has previously described in connection with the first embodiment is also applicable to this second embodiment.

A third embodiment of the P-type GAA-FET transistor 100 is now described.

The steps previously described in connection with FIGS. 1A to 1J are first implemented. At the end of these steps, the silicon of the portions 114 is not tensile stressed. As in the second embodiment, the steps which are then implemented and described below enable a significant compressive stress to be provided to the semiconductor of the channel of the transistor 100.

Unlike the second embodiment in which the remaining portions 114 are thinned before making an epitaxial growth on the thinned portions 114, the method according to the third embodiment includes first the implementation of an epitaxial growth of a third semiconductor, such as SiGe, on the portions 114. The layers of the epitaxially grown third semiconductor surround each portion 114. The epitaxially grown SiGe includes a germanium concentration between about 20% and 100% (that is corresponding to the germanium in the case of a concentration equal to 100%). The epitaxially grown SiGe can be amorphous. The thickness of the epitaxially grown SiGe layers is preferably lower than about half the distance separating two neighbouring portions 114.

A thermal annealing is then implemented in order to diffuse germanium from the epitaxially grown SiGe layers to the silicon of the portions 114. As in the second embodiment, this annealing can also modify the semiconductor located in the source and drain extension regions (semiconductor portions from the layers of the first semiconductor and located between the inner spacers 142) because of the germanium migration that can come from the epitaxially grown SiGe layers or even the source and drain regions 118, 120, enabling a more homogenous material to be obtained also in the source and drain extension regions.

A thinning of the set formed by annealing the portions 114 and the layers 126 is then made in order to obtain nanowires having the desired thickness. This thinning can be achieved by implementing an oxidation of the semiconductor of this set, and then etching the oxidised semiconductor.

Advantageously, the thickness of the nanowires after thinning is substantially equal to the initial thickness of the portions 114.

The method is then completed as previously described for the second embodiment.

The use of a compressive stressed sacrificial material for making the portions 138 which has been previously described in connection with the first embodiment is also applicable to this third embodiment.

Figure 3A:
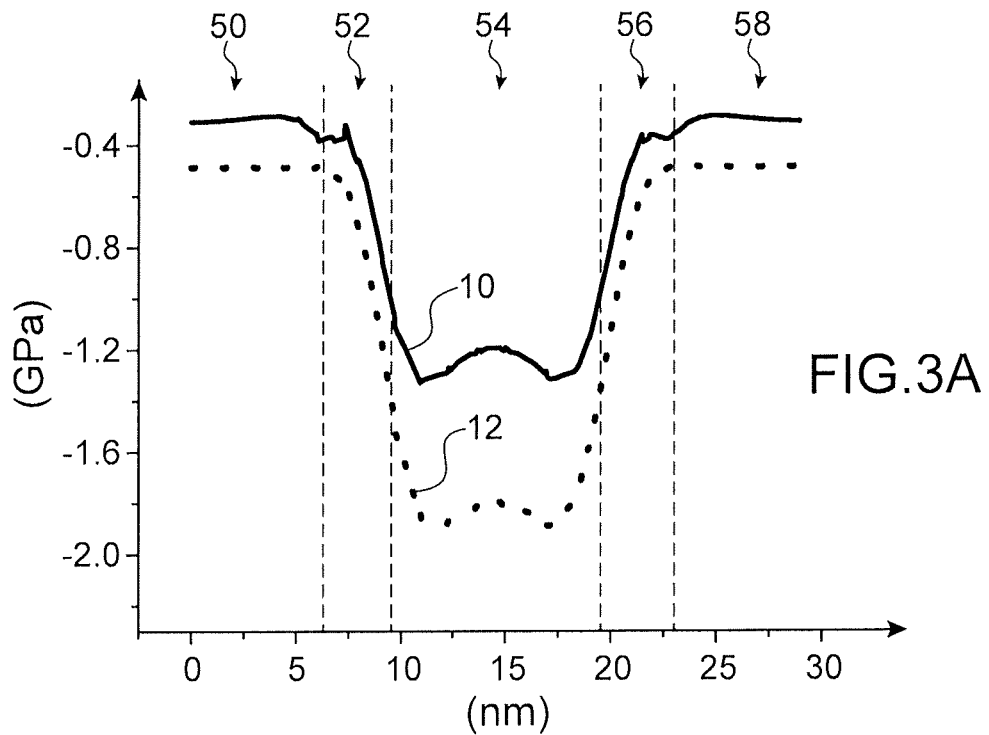
FIGS. 3A and 3B show the values of the stress obtained in the active zone of a GAA-FET transistor made according to different methods.

The curve 10 visible in FIG. 3A shows the stress within the different regions (the part referred to as 50 corresponds to the source, that referred to as 52 corresponds to the extension region located between the source and the channel, that referred to as 54 corresponds to the channel, that referred to as 56 corresponds to the extension region located between the drain and the channel, and that referred to as 58 corresponds to the drain) of a GAA-FET transistor made with a method similar to the second embodiment previously described, in which a thermal annealing is implemented in order to diffuse germanium from the layers 126 into the silicon portions 114, but in which the SiGe portions 116 are not replaced with the sacrificial material portions 138 (steps of the FIGS. 1C and 1D not implemented). By way of comparison, the curve referred to as 12 shows the stress within the different regions of the GAA-FET transistor made with a method according to the second embodiment, in which a thermal annealing is implemented in order to diffuse germanium from the layers 126 into the portions 114 and in which the SiGe portions 116 are actually replaced with the sacrificial material portions 138. It is clearly visible in FIG. 3A that the replacement of the SiGe portions 116 with the sacrificial material portions 138 enables the compressive stress to be increased in the active zone of the transistor 100, and in particular in the channel.

Figure 3B:
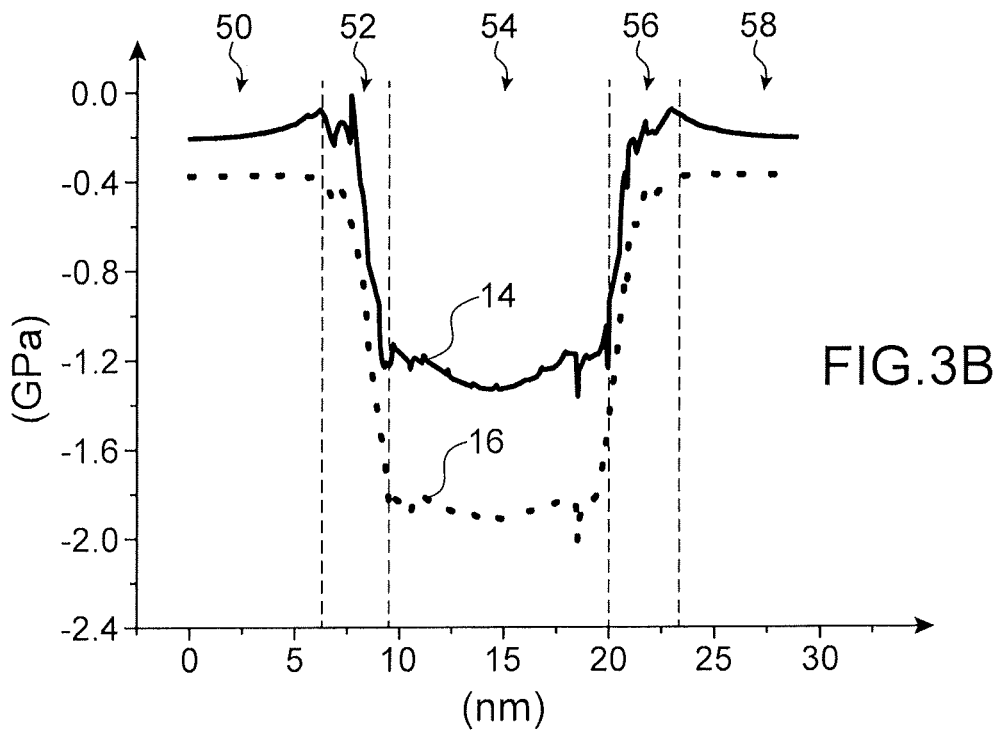

Analogously, the curve 14 visible in FIG. 3B shows the stress within the different regions of a GAA-FET transistor made with a method similar to the second embodiment previously described, but in which no thermal annealing is implemented in order to diffuse germanium from the layers 126 into the remaining silicon portions 114, and in which the SiGe portions 116 not replaced with the sacrificial material portions 138. The curve referred to as 16 shows the stress within the different regions of the GAA-FET transistor made with a method according to the second embodiment, in which no thermal annealing is implemented in order to diffuse germanium from the layers 126 into the portions 114 but in which the SiGe portions 116 are actually replaced with the sacrificial material portions 138. Once again, it is visible in FIG. 3B that the replacement of the SiGe portions 116 enables the compressive stress to be increased in the active zone of the transistor 100, and in particular in the channel.

The curves 10-16 of the FIGS. 3A and 3B show that the replacement of the SiGe portions 116 with the sacrificial material portions 138 enables, regardless of whether a thermal annealing is implemented to diffuse germanium in the silicon nanowires, an increase in the compressive stress to be obtained in the channel of the transistor in the order of 50%.

The values shown in FIGS. 3A and 3B are applicable to particular embodiments and can change depending on the characteristics of the transistors: dimensions, materials, etc.

In the different embodiments previously described, the P-type GAA-FET transistor 100 is made from a stack of layers which promote making N-type transistors because of the significant tensile stress present in the silicon portions 114 at the end of the steps described in connection with FIGS. 1A and 1B.

The implementation of a method for collectively making N- and P-type transistors co-integrated on a same substrate and made from the same stack of layers is now described.

The steps previously described in connection with steps 1A and 1B are thus collectively implemented for all the N- and P-type transistors desired to be made.

Then, the structures being obtained intended to form the N-type transistors are protected through depositing one or more packaging materials onto these structures, and the steps previously described in connection with FIGS. 1C to 1L (and possibly the additional steps specific to the second or third embodiment) are then implemented to make the P-type transistors.

The packaging materials previously formed to protect the structures intended to make the N-type transistors are then removed, and one or more packaging materials are then formed on the P-type transistors. The N-type transistors are then made through implementing similar steps (the dopings are adapted to match those of the N-type transistors) as those previously described in connection with FIGS. 1E to 1L.

Alternatively, after the steps described in connection with FIGS. 1A and 1B have been implemented, it is possible to make the N-type transistors before the P-type ones, that is to deposit one or more packaging materials protecting the structures intended to form the P-type transistors, and then to implement the steps previously described in connection with FIGS. 1E to 1L to form the N-type transistors, and then to remove the packaging material(s) protecting the structures intended to form the P-type transistors, and then to protect the N-type transistors, and finally to complete making the P-type transistors through implementing the steps of FIGS. 1C to 1L and possibly the additional steps of one of the second and third embodiments.

The invention claimed is:

1. A method for making a semiconductor device, the method comprising:
   a) etching a stack of layers arranged on a substrate and comprising at least one layer of a second semiconductor, which is crystalline, arranged between the substrate and at least one layer of a first semiconductor, which is crystalline, wherein the second semiconductor is different from the first semiconductor and subjected to a compressive stress, forming at least one nanowire stack comprising at least one second semiconductor nanowire arranged between the substrate and at least one first semiconductor nanowire,
   b) making at least one dummy gate and outer spacers, the at least one dummy gate arranged between the outer spacers, covering at least one part of the nanowire stack, then
   c) etching the nanowire stack so only said at least one part of the nanowire stack is preserved, then
   d) removing at least one portion of the second semiconductor nanowire, then
   e) depositing, into at least one space formed by removing the at least one portion of the second semiconductor nanowire, at least one sacrificial material portion, then
   f) making source and drain regions, and making inner spacers around parts of at least one portion of the first semiconductor nanowire which is covered with the outer spacers, then
   g) removing the at least one dummy gate and the at least one sacrificial material portion,
   h) making a gate between the outer spacers and around the at least one portion of the first semiconductor nanowire forming a channel.

2. The method according to claim 1, wherein at least one of the following conditions is fulfilled:
   the first semiconductor is silicon,
   the second semiconductor is SiGe having a germanium proportion higher than 50%,
   the at least one sacrificial material portion includes at least one dielectric,
   the at least one sacrificial material portion includes at least one amorphous semiconductor.

3. The method according to claim 1, wherein the at least one sacrificial material portion includes a non-stressed material or a tensile stressed material.

4. The method according to claim 1, wherein the layer of the second semiconductor has a thickness lower than its plastic relaxation critical thickness.

5. The method according to claim 1, wherein step f) includes implementing:
   etching of parts of the at least one sacrificial material portion covered by the outer spacers, and then
   making of the inner spacers in cavities formed by removing said parts of the at least one sacrificial material portion, and then
   making of the source and drain regions.

6. The method according to claim 1, further comprising, between steps g) and h):
   thinning the at least one portion of the first semiconductor nanowire,
   epitaxially growing a layer of a compressive stressed third semiconductor around the at least one portion of the first semiconductor nanowire.

7. The method according to claim 6, further including, after epitaxially growing the third semiconductor layer and before step h), implementing an annealing making a diffusion of atoms of the third semiconductor at least in the at least one portion of the first semiconductor nanowire.

8. The method according to claim 1, further comprising, between steps g) and h),:
   epitaxially growing a layer of a compressive stressed third semiconductor around the at least one portion of the first semiconductor nanowire,
   annealing making a diffusion of atoms of the third semiconductor at least in the at least one portion of the first semiconductor nanowire,
   thinning the set of the layer of third semiconductor and the at least one portion of the first semiconductor nanowire.

9. The method according to claim 6, wherein the thinning and epitaxial growth steps are implemented such that at the end of these steps, a thickness of a set comprising the third semiconductor and the at least one portion of the first semiconductor nanowire is substantially equal to a thickness of the at least one portion of the first semiconductor nanowire before implementing the thinning and epitaxial growth steps.

10. The method according to claim 1, wherein making the source and drain regions includes implementing at least one epitaxial growth of SiGe having a germanium proportion comprised between about 20% and 80%, forming the source and drain regions.

11. The method according to claim 1, wherein making the source and drain regions includes at least implementing a first epitaxial growth from at least the at least one portion of the first semiconductor nanowire, forming a first part of the source and drain regions, and then a second epitaxial growth from the first part of the source and drain regions, forming a second part of the source and drain regions.

12. The method according to claim 11, wherein the first epitaxial growth is implemented such that the first part of the source and drain regions includes semiconductor including carbon atoms.

13. The method according to claim 1, wherein the layer stack includes several layers of the first semiconductor and several layers of the second semiconductor which are alternately stacked over each other, the nanowire stack obtained at the end of step a) comprising several second semiconductor nanowires and several first semiconductor nanowires.

14. The method according to claim 1, wherein the semiconductor device is a P-type GAA-FET transistor.

15. A method for making N and P-type transistors co-integrated on a same substrate, including at least the method according to claim 1, and
   implementing steps a) to c), such that several remaining parts of the stack of layers, each of the remaining parts being covered with the at least one dummy gate and with the outer spacers, form first and second structures respectively,
   forming at least one first packaging material on the first structures,
   implementing steps d) to h) on the second structures to form the P-type transistors,
   removing the first packaging material and forming at least one second packaging material on the P-type transistors,
   making the N-type transistors from the first structures.

16. A method for making N and P-type transistors co-integrated on a same substrate, including at least the method according to claim 1, and
   implementing steps a) to c), such that several remaining parts of the stack of layers, each of the remaining parts being covered with the at least one dummy gate and with the outer spacers, form first and second structures respectively,
   forming at least one first packaging material on the second structures,
   making the N-type transistors from the first structures,
   removing the first packaging material and forming at least one second packaging material on the N-type transistors,
   implementing steps d) to h) on the second structures to form the P-type transistors.

17. The method according to claim 15, wherein making the N-type transistors includes:
   making source and drain regions and inner spacers around parts of the at least one portion of the first semiconductor nanowire which are covered with the outer spacers,
   removing the dummy gate and the at least one portion of the second semiconductor nanowire,
   making a gate between the outer spacers and around the at least one portion of the first semiconductor nanowire forming the channel.

18. The method according to claim 16, wherein making the N-type transistors includes
   making source and drain regions and inner spacers around parts of the at least one portion of the first semiconductor nanowire which are covered with the outer spacers,
   removing the dummy gate and the at least one portion of the second semiconductor nanowire,
   making a gate between the outer spacers and around the at least one portion of the first semiconductor nanowire forming the channel.

* * * * *